United States Patent
Fu et al.

(10) Patent No.: US 7,167,365 B2
(45) Date of Patent: Jan. 23, 2007

(54) BACK PLATE STRUCTURE AND PLASMA DISPLAY APPARATUS

(75) Inventors: Tsao-Yuan Fu, Taoyuan Hsien (TW); Chia-Chu Ma, Taipei (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 81 days.

(21) Appl. No.: 10/905,676

(22) Filed: Jan. 17, 2005

(65) Prior Publication Data

US 2006/0158848 A1 Jul. 20, 2006

(51) Int. Cl.
*H05K 7/20* (2006.01)

(52) U.S. Cl. .................. 361/697; 361/681; 361/704; 361/719; 313/46; 349/56; 349/58; 349/59

(58) Field of Classification Search ........... 361/681, 361/704, 707, 709, 719, 688; 174/16.1, 16.3; 313/11, 587, 46, 44, 231.1; 165/80.3, 185; 248/917, 918, 473; 349/56, 58, 59, 60
See application file for complete search history.

(56) References Cited

U.S. PATENT DOCUMENTS

| | | | | |
|---|---|---|---|---|
| 5,971,566 A | * | 10/1999 | Tani et al. | 362/294 |
| 6,077,140 A | * | 6/2000 | Kimura et al. | 445/24 |
| 6,373,702 B1 | * | 4/2002 | Oishi et al. | 361/704 |
| 6,735,084 B1 | | 5/2004 | Choi et al. | 361/704 |
| 6,774,543 B1 | * | 8/2004 | Kim et al. | 313/46 |
| 6,849,992 B1 | * | 2/2005 | Kim et al. | 313/46 |
| 2004/0036413 A1 | | 2/2004 | Bae | 313/582 |
| 2004/0242110 A1 | * | 12/2004 | Matsuda et al. | 445/6 |
| 2005/0047068 A1 | * | 3/2005 | Kim | 361/681 |
| 2005/0062383 A1 | * | 3/2005 | Bae | 313/44 |
| 2005/0117293 A1 | * | 6/2005 | Yokoyama | 361/688 |

FOREIGN PATENT DOCUMENTS

| | | | |
|---|---|---|---|
| JP | 410240138 A | * | 9/1998 |
| JP | 02000089682 A | * | 3/2000 |
| JP | 02000112370 A | * | 4/2000 |
| JP | 02003029643 A | * | 1/2003 |
| JP | 02003173147 A | * | 6/2003 |

* cited by examiner

*Primary Examiner*—Michael Datskovskiy
(74) *Attorney, Agent, or Firm*—Jiang Chyun IP Office (57) ABSTRACT

A back plate structure comprises a back plate body, at least a supporting beam and a plurality of heat dissipation members, wherein the supporting beam is fixed on a back of the back plate body and the heat dissipation members are disposed on the supporting beam. The supporting beam has a central protrusion portion and a peripheral portion. The heat dissipation members are disposed on an upper surface of the peripheral portion or on a sidewall of the central protrusion portion or into an inner portion of the central protrusion portion. Because the heat dissipation members are disposed on the supporting beam, the heat dissipation area of the present invention can be increased and therefore the heat dissipation efficiency of the plasma display apparatus can be effectively promoted. Therefore, the service life of the plasma display apparatus can be increased and also the display performance thereof can be enhanced.

16 Claims, 11 Drawing Sheets

BACK PLATE STRUCTURE AND PLASMA DISPLAY APPARATUS

BACKGROUND OF THE INVENTION

1. Field of the Invention

The present invention relates to a back plate and a display apparatus. More particularly, the present invention relates to a back plate structure and a plasma display apparatus utilizing the same.

2. Description of Related Art

In recent years, with the advancement of video technology, lighter weight, bigger display size and thinner the video apparatuses are being gradually developed. The flat panel display developed by the optoelectronics and semiconductor technology has gradually become the mainstream of the display apparatuses. The flat panel display is classified into several different types of panel displays, such as, flat panel display, liquid crystal display, organic electro-luminescent display and plasma display panel. Because the advantages of plasma display such as high luminance, wide-view angle, no radiation, free of magnetic field interference and capability of receiving digital signals directly, has led several manufacturers to continuously develop the great potential of the panel displays.

The plasma display electrically discharges gas and utilizes the discharged gas to generate luminescence. According to the principle of generating the luminescence in the plasma display, a voltage is applied to inert or mercury gas in vacuum glass tubes to transform the inert or mercury gas into plasma and thereby emit visible or ultraviolet light. Furthermore, a fluorescent material coated onto the glass tubes may be illuminated by the ultraviolet light to emit visible light.

Figure 1:
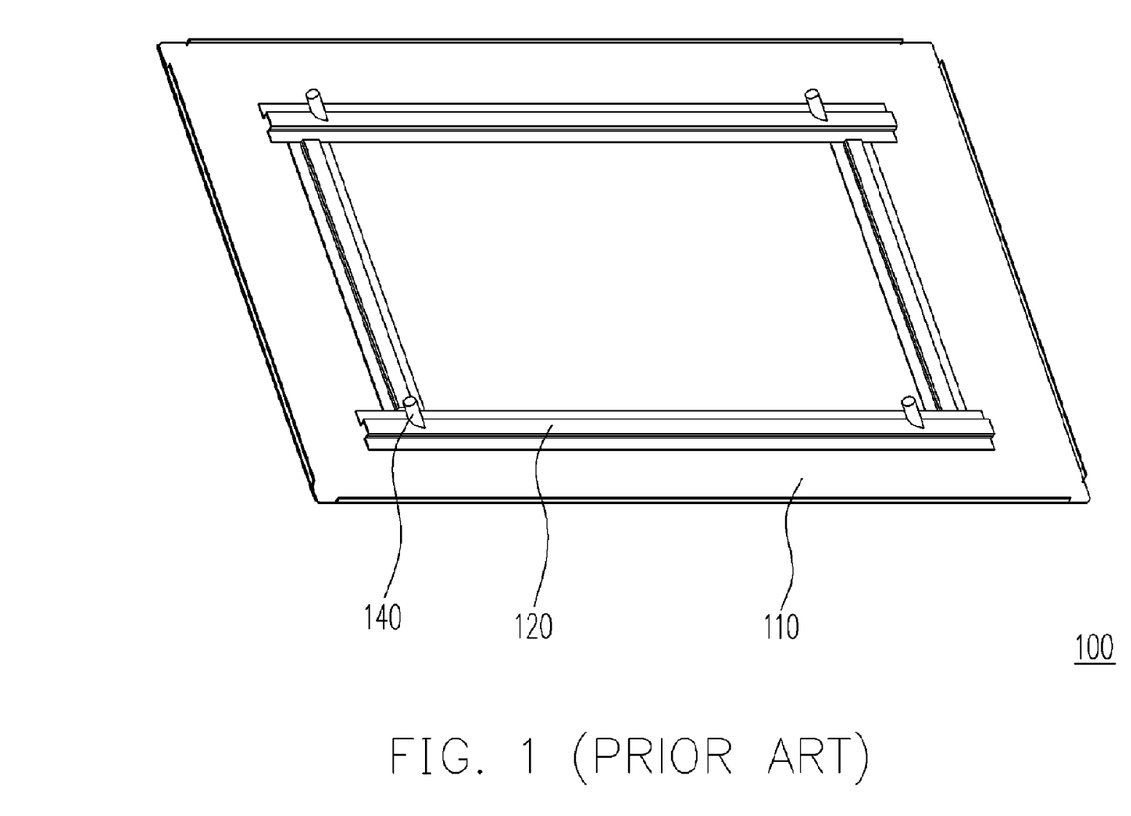
FIG. 1 is a perspective schematic view of a conventional aluminum back plate.

However, a part of energy consumed during the luminescence process in plasma displays is transformed into heat. Thus, the high driving temperature of plasma displays could adversely influence the display characteristics thereof. This could also reduce the service life of the plasma display. For solving the aforementioned problem, some proposed installing an aluminum back plate at a back of the plasma display panel to dissipate heat. FIG. 1 is a top view of a conventional aluminum back plate. As shown in FIG. 1, an aluminum back plate 100 comprises a main body 110, a plurality of supporting beams 120 and a plurality of fixing members 140. Wherein the supporting beams 120 are utilized for reinforcing the aluminum back plate 100. The supporting beams 120 are fixed on the main body 110 by using the fixing members 140. However, the heat dissipation efficiency of the aluminum back plate 100 is inadequate.

SUMMARY OF THE INVENTION

Accordingly, the present invention is directed to a back plate structure capable of promoting heat dissipation of a panel display.

The present invention is also directed to a plasma display apparatus utilizing the foregoing back plate structure so that the heat dissipation efficiency of the plasma display can be effectively promoted.

According to an embodiment of the present invention, the back plate structure comprises a back plate body, at least a supporting beam and a plurality of heat dissipation members. The supporting beam is fixed on a back of the back plate body and the heat dissipation members are disposed on the supporting beam.

According to another embodiment of the present invention, the plasma display comprises a plasma display panel and a back plate structure. The back plate structure comprises a back plate body, at least a supporting beam and a plurality of heat dissipation members. The supporting beam is disposed on a surface of the back plate body. The heat dissipation members are disposed on the supporting beam. And the plasma display panel is fixed on the back plate structure.

According to an embodiment of the present invention, the heat dissipation members and the supporting beam are formed as an integral unit.

According to an embodiment of the present invention, the heat dissipation members comprise a plurality of fins, a plurality of columns or a plurality of heat dissipation holes.

According to an embodiment of the present invention, the supporting beam comprises a central protrusion portion and a peripheral portion, wherein the heat dissipation members are disposed on an upper surface of the peripheral portion or into an inner portion of the central protrusion portion. If the heat dissipation members are comprised of fins or columns, the heat dissipation members are disposed on the upper surface of the peripheral portion, on the side wall of the central protrusion portion, or into the central protrusion portion.

According to an embodiment of the present invention, the back plate structure further comprises at least a fixing member used for fixing the supporting beam onto the back plate body.

According to an embodiment of the present invention, the material of the supporting beam and a material of the heat dissipation members may be same or different.

According to an embodiment of the present invention, the material of the supporting beam and the heat-dissipation members includes aluminum or aluminum alloy.

According to an embodiment of the present invention, the back plate structure further comprises a heat conducting film disposed on a surface of a portion of the supporting beam and on a surface of the heat dissipation members.

According to an embodiment of the present invention, because the back plate structure and the plasma display apparatus have a plurality of heat dissipation members on the supporting beam, the heat dissipation area of the back plate is effectively increased and therefore the heat dissipation efficiency of the plasma display apparatus is effectively promoted. Thus, the service life of the plasma display can be effectively increased and the display performance of the plasma display can be effectively enhanced.

DESCRIPTION OF THE EMBODIMENTS

Various specific embodiments of the present invention are disclosed below, illustrating examples of various possible implementations of the concepts of the present invention. The following description is made for the purpose of illustrating the general principles of the invention and should not be taken in a limiting sense. The scope of the invention is best determined by reference to the appended claims.

Figure 2:
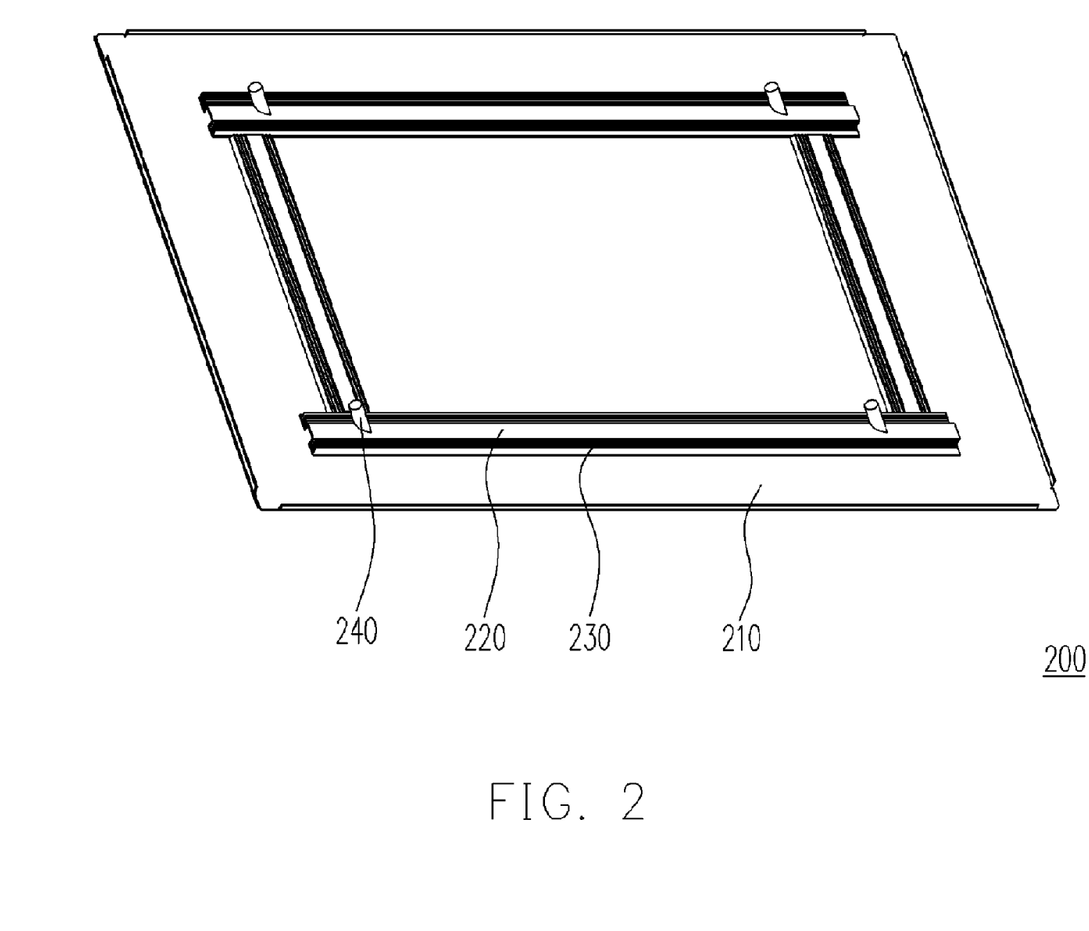
FIG. 2 is a perspective schematic view of a back plate structure according to one embodiment of the present invention.

FIG. 2 is a perspective schematic view of a back plate structure according to one embodiment of the present invention. As shown in FIG. 2, a back plate structure 200 comprises a back plate body 210, at least a supporting beam 220 and a plurality of heat dissipation members 230, wherein the supporting beam 220 is fixed on a back of the back plate body 210 and the heat dissipation members 230 are disposed on the supporting beam 220. In one embodiment of the present invention, the heat dissipation members 230 and the supporting beam 220 can be integrally formed, i.e. the heat dissipation members 230 and the supporting beam 220 are fabricated simultaneously by molding process. Alternatively, the heat dissipation members 230 and the supporting beam 220 can be also separately fabricated and then assembled together. In addition, the back plate structure 200 further comprises a plurality of fixing members 240 which can be adapted for fixing the supporting beam 220 on the back plate body 210.

Figure 3A:
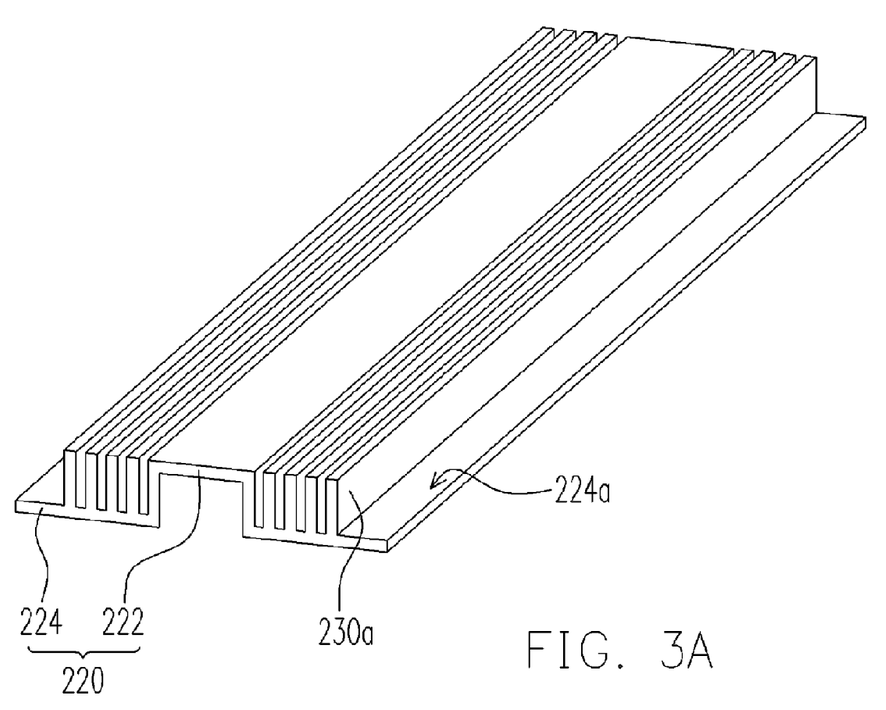
FIGS. 3A to 3C are perspective schematic views of the heat dissipation members disposed on the supporting beam according to one embodiment of the present invention.
Figure 3B:
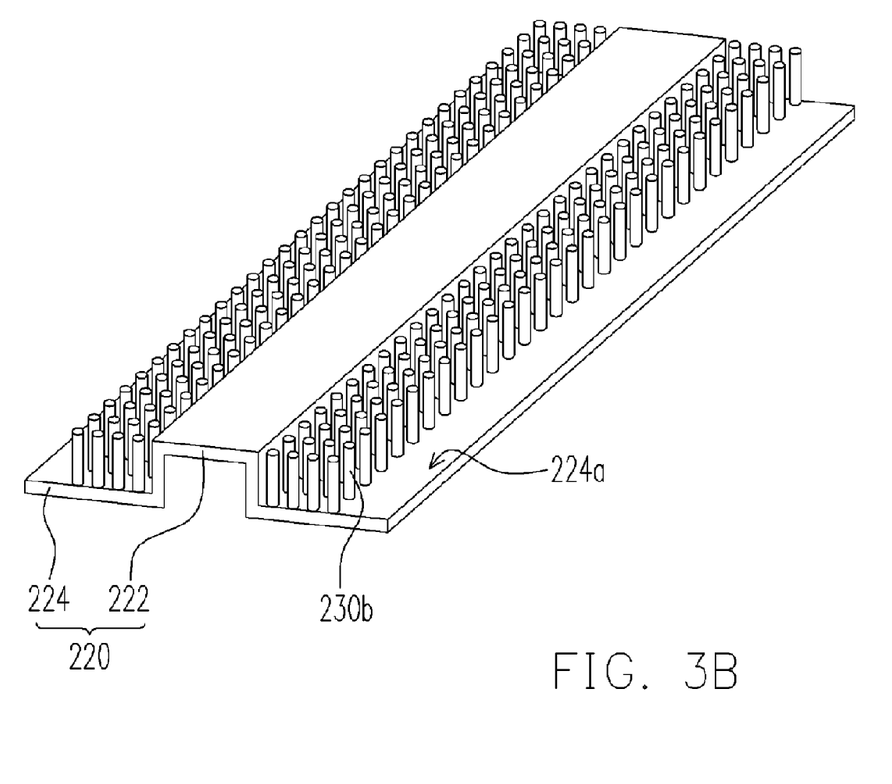
Figure 3C:
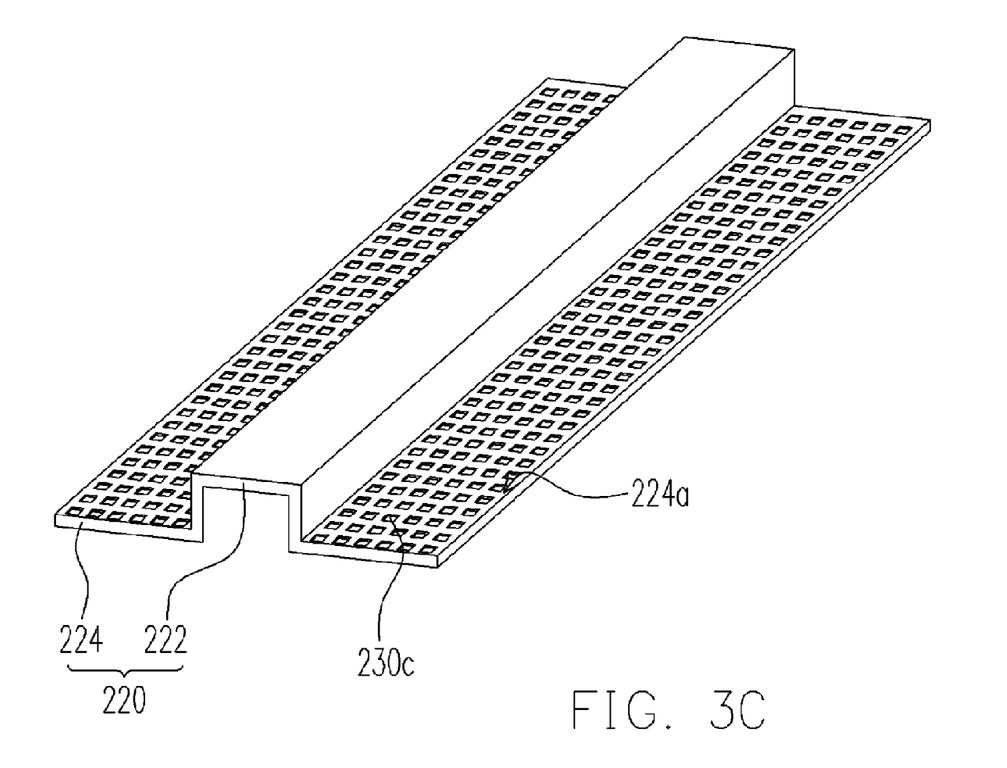

FIGS. 3A to 3C are perspective schematic views of the heat dissipation members disposed on the supporting beam according to one embodiment of the present invention. As shown in FIGS. 3A to 3C, the supporting beam 220 comprises a central protrusion portion 222 and a peripheral portion 224, and the heat dissipation members 230 are disposed on an upper surface 224a of the peripheral portion 224, for example. The heat dissipation members 230 may be configured into various types for dissipating heat, i.e. the heat dissipation members 230 may be configured into a plurality of fins 230a (as shown in FIG. 3A), a plurality of columns 230b (as shown in FIG. 3B) or a plurality of heat dissipation holes 230c (as shown in FIG. 3C). Because the heat dissipation members 230 disposed on the upper surface 224a of the peripheral portion 224 is configured as a plurality of fins 230a or a plurality of columns 230b, the heat dissipation area of the back plate structure 200 can be effectively increased.

Figure 3D:
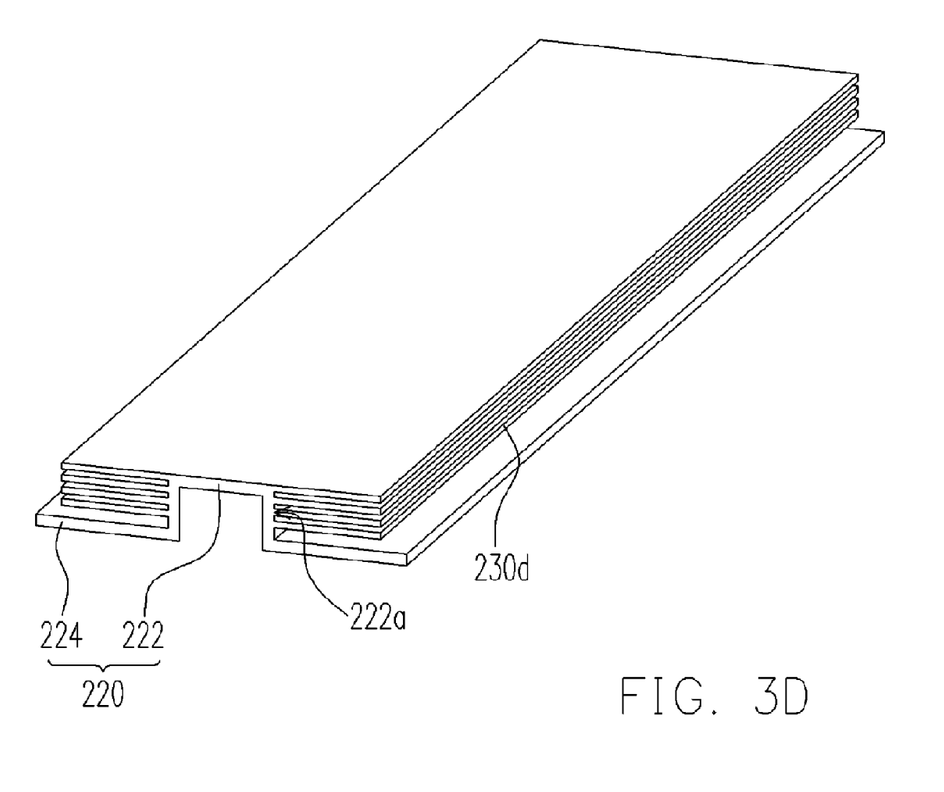
FIGS. 3D and 3E are perspective schematic views of the heat dissipation members disposed on the supporting beam according to another embodiment of the present invention.
Figure 3E:
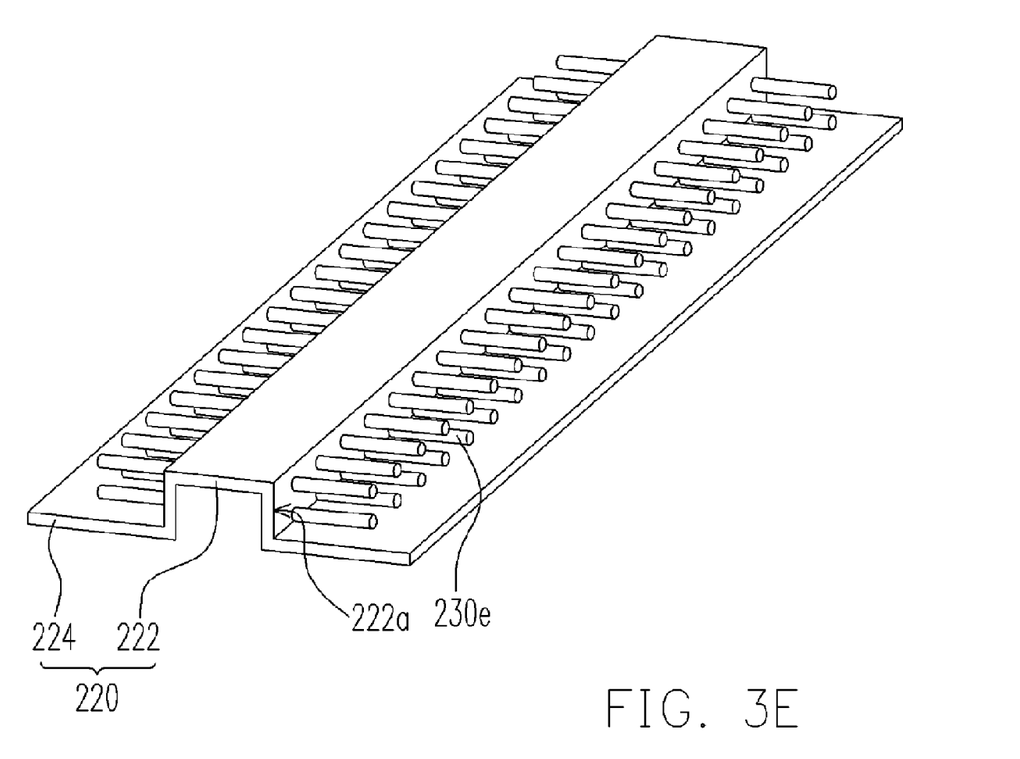

In addition, in one embodiment of the present invention, the heat dissipation members 230 may be disposed on a sidewall 222a of the central protrusion portion 222. FIGS. 3D and 3E are perspective schematic views of the heat dissipation members disposed on the supporting beam according to another embodiment of the present invention. As shown in FIGS. 3D and 3E, for example, the heat dissipation members 230 comprising a plurality of fins 230d or a plurality of columns 230e are disposed on the side wall 222a of the central protrusion portion 222.

Figure 3F:
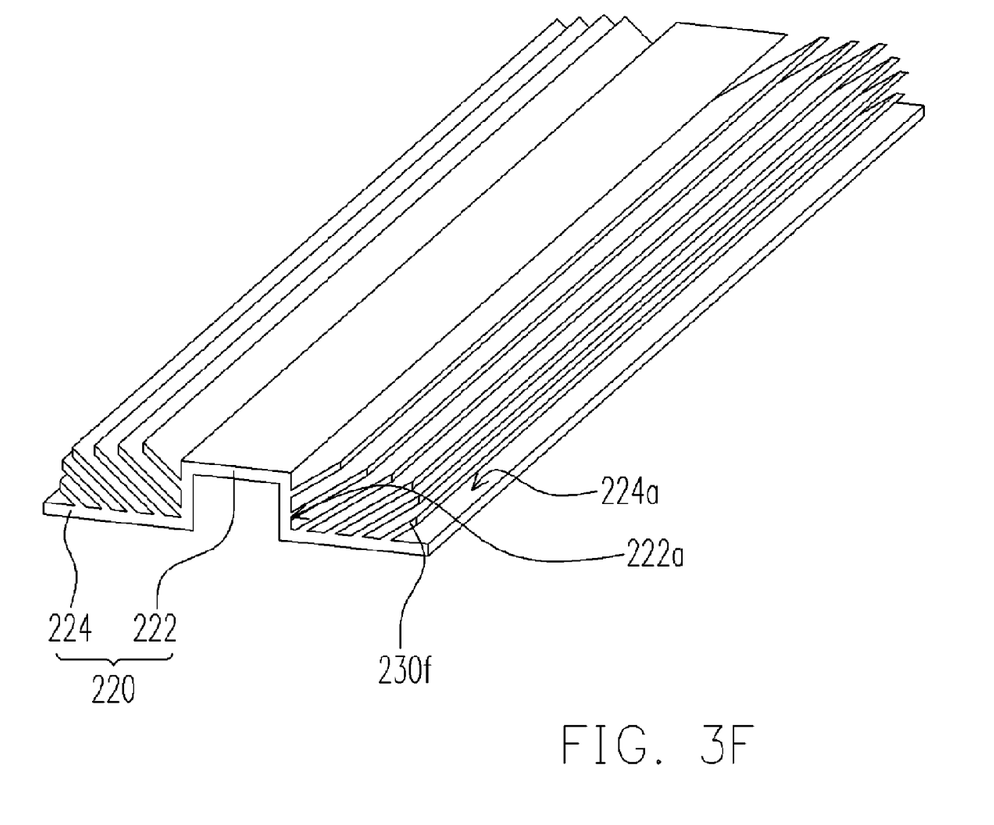
FIG. 3F is perspective schematic view of the heat dissipation members disposed on the supporting beam according to another embodiment of the present invention.

Alternatively, the heat dissipation members can be also disposed on the central protrusion portion 222 and the peripheral portion 224 of the supporting beam. FIG. 3F is perspective schematic view of the heat dissipation members disposed on the supporting beam according to another embodiment of the present invention. As shown in FIG. 3F, a plurality of fins 230f are disposed on the sidewall 222a of the central protrusion portion 222 and the upper surface 224a of the peripheral portion 224. Alternatively, a plurality of fins and a plurality of heat dissipation holes (not shown) may also be disposed on the sidewall 222a of the central protrusion portion 222 and the upper surface 224a of the peripheral portion 224 respectively.

Figure 3G:
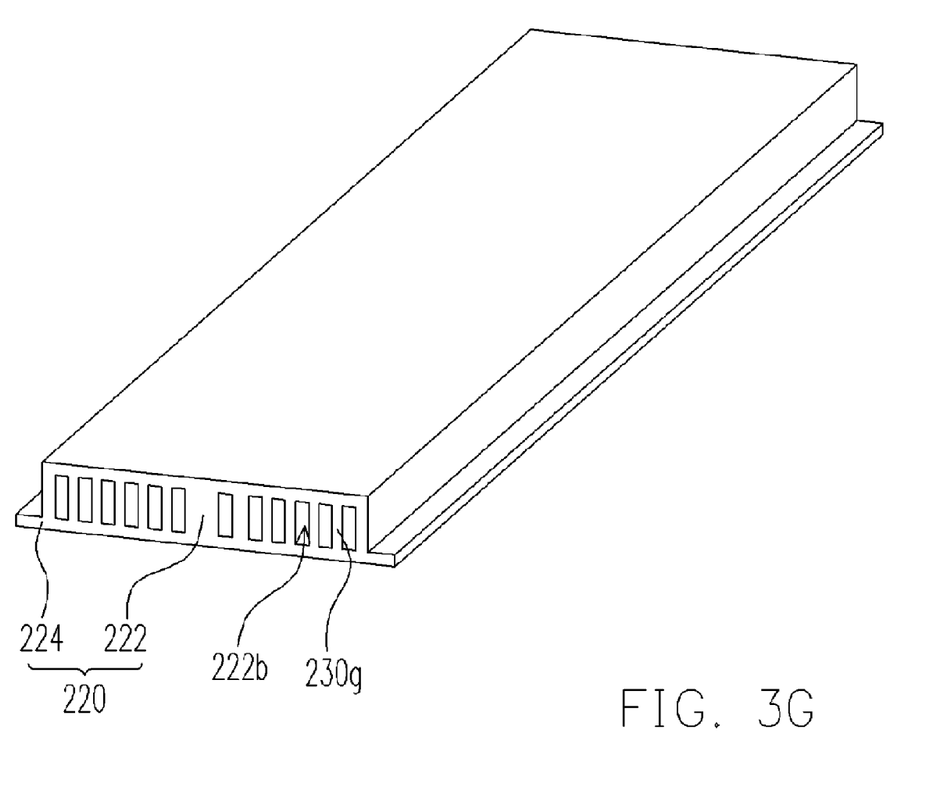
FIG. 3G is perspective schematic view of the heat dissipation members disposed on the supporting beam according to another embodiment of the present invention.

FIG. 3G is a perspective schematic view showing the heat dissipation members disposed on the supporting beam according to another embodiment of the present invention. In one embodiment of the present invention, the heat dissipation members 230g are disposed into an inner portion 222b of the central protrusion portion 222.

According to an embodiment of the present invention, the supporting beam 220 and the heat dissipation members 230 may be fabricated from a same material or different materials depending on required mechanical strength and required heat dissipation effect of the back plate structure 200. For instance, If the supporting beam 220 is required to have higher mechanical strength and the heat dissipation members 230 is required to provide higher heat dissipation effect, the supporting beam 220 can be fabricated by using a metal with higher mechanical strength and the heat dissipation members 230 may be fabricated by using a metal with higher heat dissipation effect. However, in considering from the point of simplified fabrication process, the supporting beam 220 and the heat dissipation members 230 may be formed using the same material and may be integrally as an integral unit. Therefore, the scope of the present invention is not restricted to any particular material for fabricating the supporting beam 220 and the heat dissipation members 230. In one embodiment, the material of the supporting beam 220 and the heat-dissipation members 230 may be aluminum or aluminum alloy. Accordingly, one skilled in the art will understand that the supporting beam 220 and the heat dissipation members 230 can be fabricated using same material or same as that of the back plate body 210 or different materials.

Figure 4:
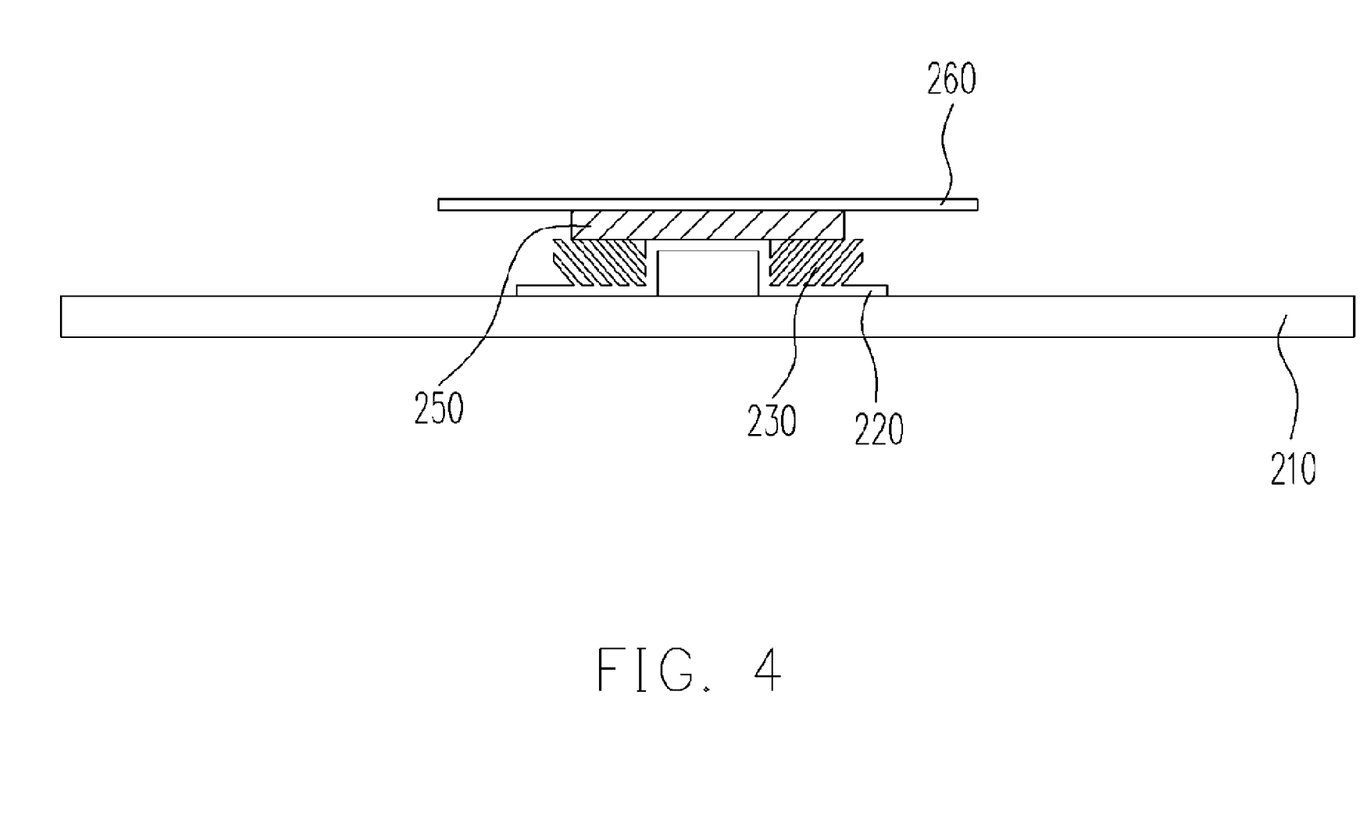
FIG. 4 is a cross sectional view of a heat conducting film disposed on the heat dissipation members according to one embodiment of the present invention.

According to an embodiment of the present invention, a heat conducting film may be included in the back plate structure in order to enhance the thermal conductivity effect of the back plate structure 200. FIG. 4 is a cross sectional view of a heat conducting film disposed on the heat dissipation members 230 according to one embodiment of the present invention. Under common condition, some circuit boards may be disposed on the back plate structure 200, and the heat may be generated due to the operation of the circuit boards. In order to improve heat transfer, a heat conducting film may be disposed between the circuit boards and the supporting beam. As shown in FIG. 4, according to one embodiment of the present invention, the back plate structure 200 further comprises a heat conducting film 250 disposed on a surface of a portion of the supporting beam 220 and on a surface of the heat dissipation members 230, i.e. the heat conducting film 250 is disposed between the supporting beam 220/the heat dissipation members 230 and the circuit boards 260. The heat can be conducted from the circuit boards 260 to the heat dissipation members 230 by the heat conducting film 250. In the present invention, because the heat dissipation members 230 disposed on the supporting beam 220 have larger heat dissipation area, the heat from the aforementioned circuit boards 260 or other devices disposed over the back plate structure 260 can be dissipated efficiently by the heat dissipation members 230.

Figure 5:
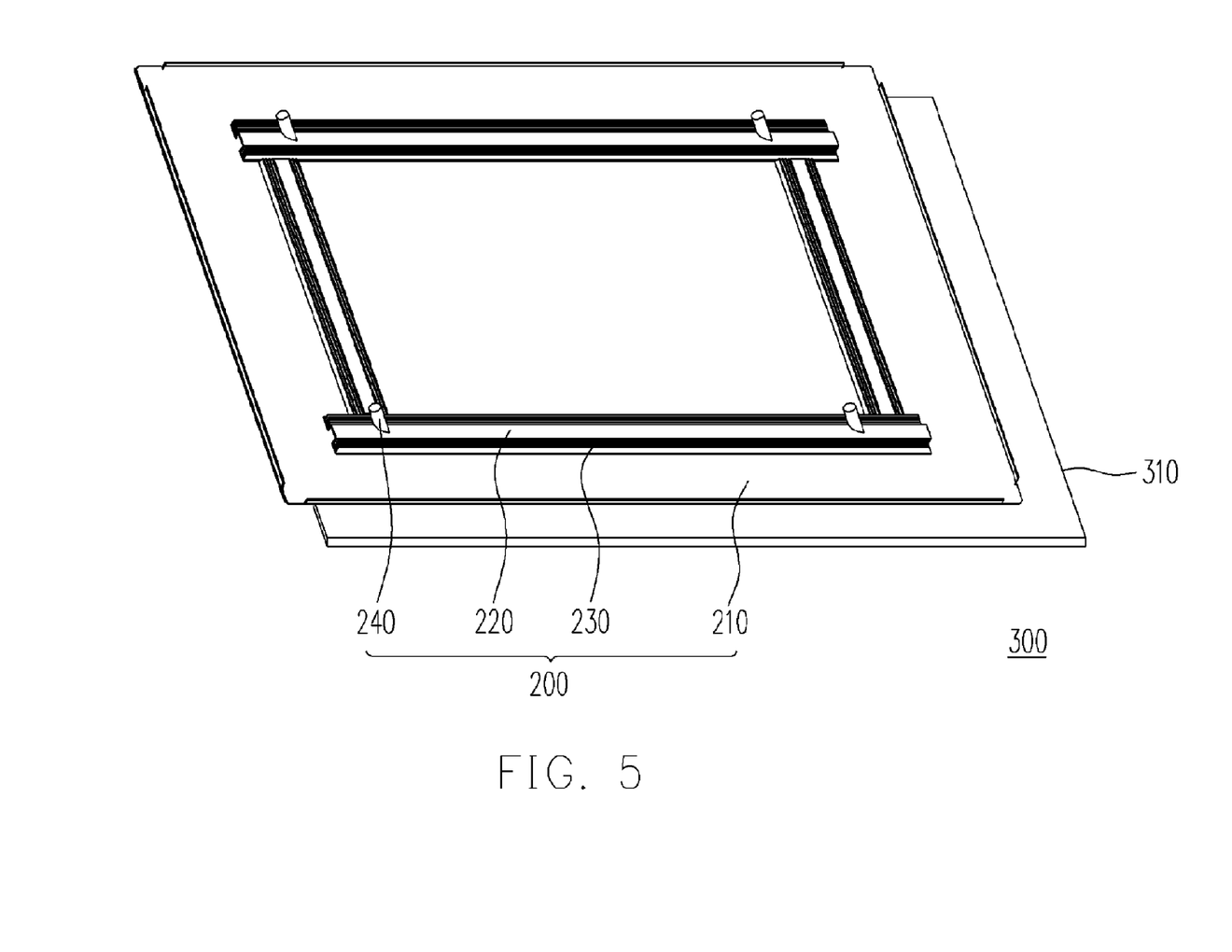
FIG. 5 is perspective schematic view of a back of a plasma display apparatus according to one embodiment of the present invention.

In addition, the above-mentioned back plate structure can be also applied in a plasma display apparatus to enhance a heat dissipation performance of the plasma display apparatus. FIG. 5 is perspective schematic view of a back of a plasma display apparatus according to one embodiment of the present invention. The plasma display apparatus 300 comprises a plasma display panel 310 and a back plate structure 200, wherein the back plate structure 200 comprises a back plate body 210, at least a supporting beam 220 and a plurality of heat dissipation members 230. The supporting beam 220 is disposed on a surface of the back plate body 210. The heat dissipation members 230 are disposed on the supporting beam 220. And the plasma display panel 310 is fixed on the back plate structure 200.

As shown in FIG. 5, in the plasma display apparatus 300, the connection scheme and the heat dissipation technique utilizing special structure of the supporting beams 220 and the heat dissipation members 230 of the back plate structure 200 are similar to those described in the above embodiment of the present invention and therefore the detailed description thereof are not repeated. In addition, the back plate structure 200 of the plasma display apparatus 300 further comprises a plurality of fixing members 240 used for fixing the supporting beams 220 on the back plate body 210. And in the plasma display apparatus 300, the supporting beam 220 and the heat dissipation members 230 of the back plate structure 200 may be fabricated from a same material. In one embodiment, the material of the supporting beam 220 and the heat-dissipation members 230 may be aluminum or aluminum alloy. Furthermore, the back plate structure 200 further comprises a heat conducting film (not shown) disposed on a surface of a portion of the supporting beam 220 and on a surface of the heat dissipation members 230, i.e. the heat conducting film is disposed between the supporting beam 220/the heat dissipation members 230 and the circuit boards (not shown). Thereby the plasma display apparatus 300 of the present invention can efficiently dissipate the heat from the plasma display panel 310, the circuit boards or other elements outside by means of the heat dissipation members 230 disposed on the supporting beam 220.

Accordingly, the back plate structure and the plasma display apparatus of the present invention have the following advantages:

(1) Compared with the conventional back plate structure and plasma display apparatus, a plurality of heat dissipation members are disposed on the supporting beam of the back plate structure, and therefore the heat dissipation area can be effectively increased and thus the heat dissipation efficiency of the back plate structure can be effectively promoted.

(2) Because the back plate structure of the present invention can be practically applied in the plasma display apparatus providing higher heat dissipation efficiency capability, therefore the service life of the plasma display apparatus can be effectively prolonged and also the display performance thereof can be effectively enhanced.

(3) The heat from the circuit boards disposed on the back plate structure can be conducted to the heat dissipation members by the heat conducting film to further enhance the operation conditions of the circuit boards.

The above description provides a full and complete description of the embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A back plate structure suitable for a display, comprising:
    a back plate body;
    at least a supporting beam, fixed on a back of the back plate body, wherein the supporting beam has a central protrusion portion and a peripheral portion; and
    a plurality of heat dissipation members, disposed on at least one of an upper surface of the peripheral portion, a sidewall of the central protrusion portion and an inner portion of the central protrusion portion.

2. The back plate structure of claim 1, wherein the heat dissipation members and the supporting beam are integrally formed.

3. The back plate structure of claim 1, wherein the heat dissipation members comprise a plurality of fins, a plurality of columns or a plurality of heat dissipation holes.

4. The back plate structure of claim 1, wherein the heat dissipation members comprise a plurality of fins or a plurality of columns disposed on the upper surface of the peripheral portion and the sidewall of the central protrusion portion.

5. The back plate structure of claim 1, further comprising at least a fixing member used for fixing the supporting beam on the back plate body.

6. The back plate structure of claim 1, wherein the supporting beam and the heat dissipation members are fabricated using a same or different materials.

7. The back plate structure of claim 1, wherein a material of the supporting beam and the heat-dissipation members comprises aluminum or aluminum alloy.

8. The back plate structure of claim 1, further comprising a heat conducting film disposed on a surface of a portion of the supporting beam and a surface of the heat dissipation members.

9. A plasma display apparatus, comprising:
    a back plate structure, comprising:
        a back plate body;
        at least a supporting beam, fixed on a back of the back plate body, wherein the supporting beam has a central protrusion portion and a peripheral portion; and
        a plurality of heat dissipation members, disposed on at least one of an upper surface of the peripheral portion, a sidewall of the central protrusion portion and an inner portion of the central protrusion portion; and
    a plasma display panel fixed on the back plate structure.

10. The plasma display apparatus of claim 9, wherein the heat dissipation members and the supporting beam are integrally formed.

11. The plasma display apparatus of claim 9, wherein the heat dissipation members comprise a plurality of fins, a plurality of columns or a plurality of heat dissipation holes.

12. The plasma display apparatus of claim 9, wherein the heat dissipation members comprise a plurality of fins or a plurality of columns disposed on the upper surface of the peripheral portion and the sidewall of the central protrusion portion.

13. The plasma display apparatus of claim 9, further comprising at least a fixing member used for fixing the supporting beam on the back plate body.

14. The plasma display apparatus of claim 9, wherein the supporting beam and the heat dissipation members are fabricated using a same material or different materials.

15. The plasma display apparatus of claim 9, wherein a material of the supporting beam and the heat-dissipation members comprises aluminum or aluminum alloy.

16. The plasma display apparatus of claim 9, further comprising a heat conducting film disposed on a surface of a portion of the supporting beam and a surface of the heat dissipation members.

* * * * *